United States Patent [19]
Bishop et al.

[11] Patent Number: 5,272,371
[45] Date of Patent: Dec. 21, 1993

[54] ELECTROSTATIC DISCHARGE PROTECTION STRUCTURE

[75] Inventors: William A. Bishop, Irving; Mehdi Zamanian; Tsiu C. Chan, both of Carrollton, all of Tex.

[73] Assignee: SGS-Thomson Microelectronics, Inc., Carrollton, Tex.

[21] Appl. No.: 794,488

[22] Filed: Nov. 19, 1991

[51] Int. Cl.⁵ .............................................. H01L 23/62
[52] U.S. Cl. ..................................... 257/362; 257/361
[58] Field of Search ................... 357/23.13, 35, 40, 41; 257/361, 362

[56] References Cited

U.S. PATENT DOCUMENTS

| | | | |
|---|---|---|---|
| 3,787,717 | 1/1974 | Fischer et al. | 357/23.13 |
| 4,692,781 | 9/1987 | Rountree et al. | 357/23.13 |
| 4,819,047 | 4/1989 | Gilfeather et al. | 357/40 |
| 4,855,620 | 8/1989 | Duvvury et al. | 307/448 |
| 4,896,243 | 1/1990 | Chatterjee et al. | 362/91 |
| 4,987,465 | 1/1991 | Longcor et al. | 357/41 |
| 5,016,078 | 5/1991 | Tailliet | 357/35 |
| 5,043,782 | 8/1991 | Avery | 357/23.13 |
| 5,079,612 | 1/1992 | Takamoto et al. | 357/23.13 |

FOREIGN PATENT DOCUMENTS

| | | | |
|---|---|---|---|
| 0269946 | 7/1989 | Fed. Rep. of Germany | 357/23.13 |
| 60-233856 | 11/1985 | Japan | 357/35 |
| 62-36867 | 2/1987 | Japan | 357/23.13 |
| WO90/15440 | 12/1990 | PCT Int'l Appl. | 357/23.13 |

OTHER PUBLICATIONS

IBM Technical Disclosure Bulletin, vol. 23 No. 2, Jul. 1980, "Lateral NPN Protect Device" by Banker et al., pp. 594–595.

Avery, "Using SCR's as Transient Protection Structures in Integrated Circuits," Electrical Overstress-/Electrostatic Discharge Symposium Proceeding, (ITT Research Institute, 1983), pp. 177–180.

Rountree, et al., "A Process-Tolerant Input Protection Circuit for Advanced CMOS Processes", Electrical Overstress/Electrostatic Discharge Symposium Proceedings, (EOS/ESD Association and ITT Research Institute, 1988), pp. 201–205.

*Primary Examiner*—Rolf Hille
*Assistant Examiner*—Steven Loke
*Attorney, Agent, or Firm*—Rodney M. Anderson; Lisa K. Jorgenson; Richard K. Robinson

[57] ABSTRACT

An ESD protection circuit and structure for implementation within an integrated circuit is disclosed. The protection circuit includes a diode, serving as a triggering device, and a lateral bipolar transistor. The triggering voltage of said diode is selected by an implant underlying a first field oxide structure adjacent a first diffused region to which the external terminal is connected. The lateral bipolar transistor uses the first diffused region to which the external terminal is connected as the collector region, a second diffused region opposite the first field oxide structure from said first diffused region as the emitter, and the substrate, or epitaxial layer, as the base. A second field oxide structure encircles the emitter region and has a distance thereacross which is selected in order to provide sufficient base resistance that, upon junction breakdown of the diode, the base-emitter junction of the lateral transistor is forward biased and the transistor turned on.

20 Claims, 3 Drawing Sheets

ELECTROSTATIC DISCHARGE PROTECTION STRUCTURE

This invention is in the field of integrated circuits, and is more particularly directed to the construction of devices connected to external terminals, such devices for protecting against electrostatic discharge at said terminals.

BACKGROUND OF THE INVENTION

Damage from electrostatic discharge (ESD) is a significant failure mechanism in modern integrated circuits, particularly as integrated circuit physical dimensions continue to shrink to the sub-micron range. Electrically, an ESD event occurs upon contact of one or more of the terminals of an integrated circuit terminals with a body that is statically charged to a high voltage (up to on the order of thousands of volts). This level of static charge is readily generated by the triboelectric effect and other mechanisms acting upon humans or manufacturing equipment. Upon contact, the integrated circuit discharges the charged body through its active devices and DC current paths. If the amount of charge is excessive, however, the discharge current density can damage the integrated circuit so that it is no longer functional, or so that it is more prone to later life failure. ESD damage thus is a cause of yield loss in manufacturing, and also poorer reliability in use.

It is common practice in the art to implement, into each integrated circuit, ESD protection devices connected to the external terminals of the circuit. ESD protection devices are designed to provide a current path of sufficient capacity to safely discharge the charge applied thereto by a charged body in an ESD event, but to not inhibit the functionality of the integrated circuit in normal operation. The addition of ESD protection devices necessarily add parasitic effects that degrade circuit performance; in some cases such as series resistors, the ESD protection devices directly add delay to electrical performance. Accordingly, a desirable goal for ESD protection devices is to provide a high capacity current path, which is readily triggered during an ESD event but which can never trigger during normal operation, and which presents minimal effect on circuit performance.

An example of a conventional ESD protection device for bipolar integrated circuits is described in Avery, "Using SCR's as Transient Protection Structures in Integrated Circuits", *Electrical Overstress/Electrostatic Discharge Symposium Proceedings*, (IIT Research Institute, 1983), pp. 177–180. The protection device described in this paper is a vertical silicon-controlled rectifier (SCR). As is well known, SCRs are able to conduct relatively large amounts of current with relatively little resistance, particularly when triggered to operate in their "snap-back", or "negative resistance" regime.

ESD sensitivity is particularly acute in metal-oxide-semiconductor (MOS) circuits, as such circuits primarily rely on lateral surface conduction as opposed to vertical conduction to buried layers, as is the case in bipolar circuits. Furthermore, the gate dielectric of MOS transistors is generally quite sensitive to overvoltage conditions, particularly in modern circuits having ultra-thin gate dielectrics of thicknesses on the order of 10 nm or less. An example of a lateral SCR useful in MOS circuits is described in an article by Rountree, et al., "A Process-Tolerant Input Protection Circuit for Advanced CMOS Processes", *Electrical Overstress/Electrostatic Discharge Symposium Proceedings*, (EOS-/ESD Association and IIT Research Institute, 1988), pp. 201–205. As described on page 202 relative to FIG. 2, this lateral SCR includes a parasitic n-p-n transistor formed by the n-well, p-substrate and the n+ region connected to the common terminal, while the parasitic p-n-p transistor is formed by the p+ region connected to the terminal, the n-well and the p-substrate.

Another protection scheme suitable for MOS technology which incorporates the lateral SCR is described in U.S. Pat. No. 4,896,243, issued Jan. 23, 1990. In this scheme, a field plate diode, connected in parallel with the SCR, turns on first in response to an ESD event. The higher capacity, but slower firing, lateral SCR is subsequently triggered by junction breakdown, as described at column 5, lines 36 through 43 of the reference.

By way of further background, U.S. Pat. No. 4,692,781 issued Sep. 8, 1987 describes a thick field oxide transistor used as an ESD protection device in an MOS integrated circuit. This reference further describes particular layout considerations useful in the construction of such a device, especially regarding the distance between metal contact to diffusion and the edge of the diffusion.

By way of further background, U.S. Pat. No. 4,855,620 issued Aug. 8, 1989 describes an ESD protection scheme for output devices. According to this reference, thick field oxide transistors are connected in parallel with the output driver transistors, and turn on at voltages greater than the power supply voltage of the driver so that normal operation if not affected. Copending application Ser. No. 711,549, filed Jun. 4, 1991, entitled "ESD Protection Circuit", assigned to SGS-Thomson Microelectronics, Inc. and incorporated herein by this reference, discloses a lateral n-p-n bipolar transistor useful as an ESD protection device, particularly for output devices.

By way of further background, yet another ESD protection scheme according to the prior art will now be described relative to FIGS. 5a and 5b. This scheme has been used in conjunction with output terminals, including common input/output terminals, in conventional integrated circuits. As illustrated in FIG. 5a, p-type substrate 102 has several field oxide isolation structures 106 at a surface, defining several active regions 108, 110, 111 therebetween. Interlevel dielectric layer 112 overlies the structure, with metal electrodes 114 making contact to underlying active regions 108, 110, 111 therethrough. N-type wells 104 are disposed under the locations at which metallization 114 makes contact to n-type active regions 108. Also in this conventional scheme, $V_{ss}$ metallization 114b and n+ regions 108b, 108c are present on all four sides of the bond pad PAD.

As shown in FIG. 5b, the structure of FIG. 5a is incorporated into an n-channel push-pull output driver. N-type active region 111 of FIG. 5a is the drain of n-type pull-down transistor 115 of FIG. 5b. The structure of FIG. 5a includes a lateral bipolar transistor 113 connected to pad PAD, having n+ region 108a as the collector, substrate 102 as the base, and n+ region 108b as the emitter; as illustrated in FIG. 5a, emitter region 108b is connected to ground ($V_{ss}$) by way of metal electrode 114b. In addition, a collector-base diode is presented considering n+ region 108a as the cathode and substrate 102 as the anode. A similar lateral bipolar transistor is formed in parallel with pull-up transistor 117.

In this conventional structure, p+ region 110 contacts p-type substrate 102 and, in normal operation, is driven by a charge pump to a negative voltage $V_{bb}$ to present a back-gate bias to the transistors in the integrated circuit (such as transistors 115, 117 of the output driver of FIG. 5b). However, since ESD events generally occur when the integrated circuit is not powered up, substrate 102 is effectively floating during an ESD event.

As noted above, bipolar conduction as an effective method of safely conducting charge during an ESD event is well known. In the scheme of FIGS. 5a and 5b, however, when a sufficiently positive voltage is applied to pad PAD so as to cause breakdown of the diode between n+ region 108a and substrate 102, the state of parasitic bipolar transistor 113 is indefinite because the base of transistor 113 (i.e., substrate 102) is floating. In some cases, where the effective base resistance of bipolar transistor 113 is small, bipolar transistor 113 may not turn on (the base-emitter voltage being insufficient to forward bias the base-emitter junction) even for damaging levels of discharge current. In addition, even though n+ regions 108b, 108c encircle the pad PAD, the base contact regions 110 does not; as such, the effective base width of the transistor is not controlled, with current crowding likely at some locations, limiting bipolar conduction (if initiated at all).

It is therefore an object of this invention to provide an ESD protection scheme which allows for a controlled base resistance to be readily implemented into the circuit, thus providing stable operation of a parasitic bipolar transistor ESD protection device.

It is a further object of this invention to provide a large base width bipolar transistor ESD protection device, thus providing large discharge capacity.

It is a further object of the present invention to provide an improved technique for controlling turn-on voltage and current for the ESD protection scheme.

It is a further object of the present invention to provide such a technique which presents minimal performance degradation in normal operation.

It is a further object of the present invention to provide such a scheme where the bipolar transistor is protected from thermal runaway.

Other objects and advantages of the invention will be apparent to those of ordinary skill in the art having reference to the following specification together with the drawings.

SUMMARY OF THE INVENTION

The present invention may be incorporated into an integrated circuit by way of a lateral bipolar transistor having a controlled and uniform series base resistance. An external terminal of the circuit is connected to the collector of the parasitic bipolar transistor. The collector is separated from the emitter region by a field oxide structure. Metal contacts the heavily doped collector and emitter regions at locations over a well, so that junction spiking through the heavily doped region does not cause leakage; these wells are pulled back from the edges of the field oxide region so that the collector-base junction breakdown voltage is not excessively high. A second field oxide structure is provided between the emitter region and the base contact, and has a length selected to provide sufficient parasitic base resistance in the bipolar transistor that the parasitic base-emitter junction is forward biased, and bipolar conduction initiated, as a result of the breakdown current caused by an ESD event.

BRIEF DESCRIPTION OF THE DRAWINGS

FIG. 5b is an electrical diagram, in schematic form, of the prior art ESD protection scheme illustrated in FIG. 5a.

DETAILED DESCRIPTION OF THE PREFERRED EMBODIMENT

Referring first to the electrical schematic of FIG. 1, an input protection circuit implemented into integrated circuit 1 according to the preferred embodiment of the invention, will be described in detail. In this embodiment of the invention, pad 14a serves as an external terminal of integrated circuit 1. As is conventional in the art, pad 14a is connected by way of a wire bond or other lead to a package pin or external terminal. As such, signals may be received or presented at pad 14a during the normal operation of the integrated circuit, or alternatively pad 14a may receive a bias or reference voltage. The example of the present invention illustrated in FIG. 1 is used in conjunction with an input terminal to integrated circuit 1.

Figure 1:
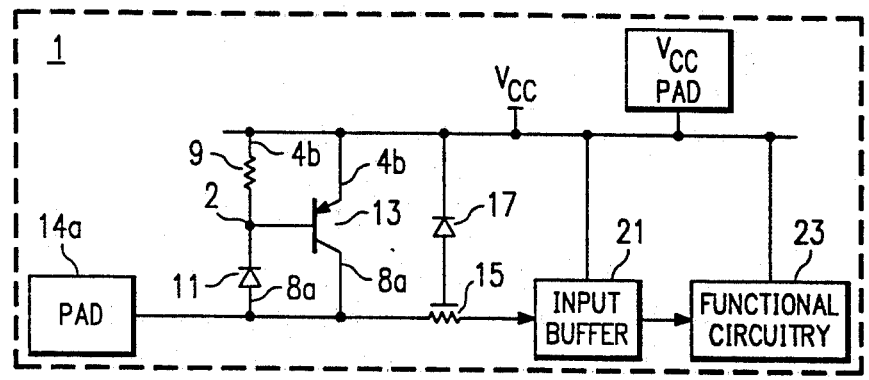
FIG. 1 is an electrical diagram, in schematic form, of the ESD protection scheme according to a first preferred embodiment of the invention.

Power supply voltage $V_{cc}$ is used in connection with this embodiment of the invention, and is received at another terminal of the integrated circuit, as shown in FIG. 1. Also, by way of example, the circuit of this embodiment of the invention is fabricated into an n-type substrate; as such, the fabrication of a lateral p-n-p bipolar transistor for ESD protection is facilitated. In this example, lateral p-n-p bipolar transistor 13 has its emitter connected to $V_{cc}$ and its collector connected to pad 14a. Diode 11 has its anode connected to the collector of transistor 13, and has its cathode connected to the base of bipolar transistor 13 and also to power supply $V_{cc}$ via resistor 9. As will be noted hereinbelow, resistor 9 is selected to ensure that the base-emitter junction of transistor 11 is forward-biased upon junction breakdown of diode 11. In this example, the resistance of resistor 9 is preferably on the order of 500 Ω.

As noted hereinabove, the ESD protection scheme in this example is used in connection with an input to integrated circuit 1, where integrated circuit 1 is fabricated according to MOS technology. Pad 14a is thus coupled to input buffer 21 on its way to functional circuitry 23 in integrated circuit 1. The device sizes in input buffer 21 are generally kept quite small for performance reasons; as such, the discharge capacity of input buffer 21 for an ESD event is quite limited. It is therefore common practice to include, as in this case, series resistor 15 connected between pad 14a and input buffer 21, to further reduce the ESD vulnerability of the circuit. Series resistor 15 generally has a resistance value on the order of 1000 Ω. In this example, resistor 15 is a p-type diffusion resistor formed in an n-type substrate, and thus is diode coupled to $V_{cc}$ ($V_{cc}$ being coupled to the n-type substrate). As will also be noted hereinbelow, however, it is contemplated that the scheme according to the present invention will have sufficient capacity that the series resistor 15 may be omitted.

Figure 2:
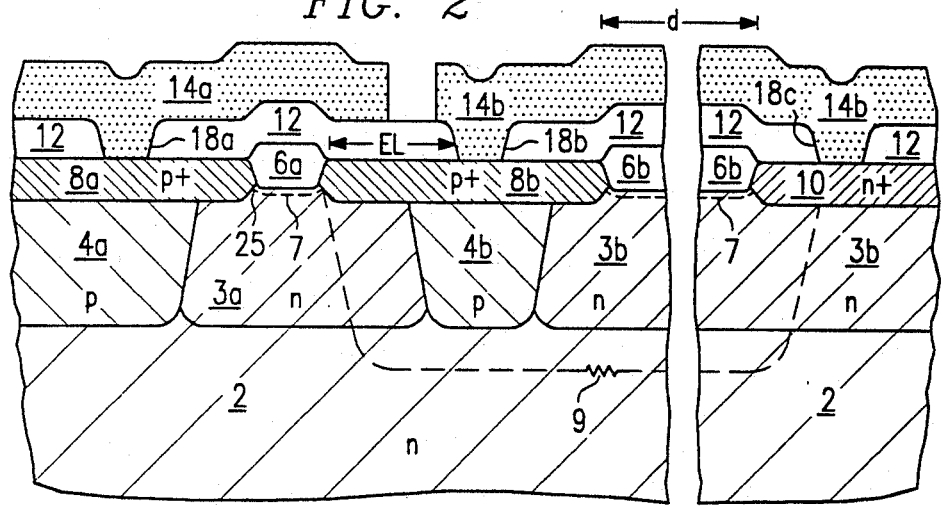
FIG. 2 is a cross-sectional elevation of a device constructed according to the first preferred embodiment of the invention.

Referring now to FIG. 2 in combination with FIG. 1, the construction of the input protection circuit according to this embodiment of the invention will now be described. The reference numerals of in FIG. 2 that refer to physical structures are also used in FIG. 1 to indicate their location in the circuit diagram.

In this embodiment of the invention, the integrated circuit is fabricated at a surface of n-wells 3 formed within a relatively lightly-doped n-type substrate 2 having an impurity concentration on the order of $6E14 cm^{-3}$. Alternatively, n-type region 2 may itself serve as the active surface; further in the alternative, n-type region 2 into which wells 3 are formed (or not formed, as the case may be) may be an epitaxial layer formed over a substrate or, in the case of silicon-on-insulator, over an insulating layer such as silicon dioxide or sapphire. As will be apparent from its description, the present invention may alternatively be implemented into a p-type substrate or epitaxial layer, with or without p-type wells formed therein, thus forming an n-p-n bipolar transistor, and obtaining the same benefits.

At selected portions of the surface of substrate 2 are field oxide structures 6a, 6b for isolating active regions of the surface from one another in the conventional manner. Field oxide structures 6a, 6b may be formed according to conventional methods, such as local oxidation of silicon (LOCOS) and modifications thereof. In addition, a channel stop implant may be performed either prior to or through field oxide structures 6 to increase the threshold voltage of the parasitic field oxide transistor between active regions on either side thereof, in the conventional manner.

Where field oxide structures are formed at the surface of n-type single crystal material, such as n-wells 3a, 3b at the surface of n-type substrate 2, a channel-stop implant under the field oxide structures is generally not performed. This is because the threshold voltage of a parasitic p-channel field oxide transistor, and also its punch-through voltage, are both generally sufficiently high that no such implant is necessary. According to this embodiment of the invention, however, the firing voltage of the ESD protection circuit is determined by the junction breakdown voltage under field oxide structure 6a. As a result, an n-type implant under field oxide structures 6 is preferred according to this embodiment of the invention, in order to increase the impurity concentration under field oxide structure 6a, lowering its junction breakdown voltage and facilitating firing of the ESD protection circuit in an ESD event. An example of such an implant, performed prior to field oxidation, uses phosphorous as the implanted species, at a dose of $2.8E12 cm^{-2}$ and energy of 60 keV, resulting in a surface impurity concentration of on the order of $3E16 cm^{-3}$ under field oxide structure 6 (shown as n-type region 7 in FIG. 2). This implant, besides setting the firing voltage of the ESD protection circuit according to this embodiment of the invention, will also increase the field oxide transistor threshold voltage and the punch-through voltage elsewhere on the integrated circuit, improving isolation in n-type well or substrate regions, particularly where the length of field oxide structures 6 between active regions is quite narrow.

Within the protection circuit of FIG. 2, heavily doped p-type regions 8a, 8b are formed on opposite sides of field oxide structure 6a. The depth and impurity concentration of p+ regions 8a, 8b is preferably the same as the source and drain regions in p-channel transistors formed elsewhere in the integrated circuit, for ease of manufacture. P+ region 8b is also separated from heavily doped n-type region 10 by field oxide structure 6b in this embodiment of the invention, with n-type implanted region 7 thereunder as described hereinabove. Within each of p+ regions 8a, 8b, relatively lightly doped p-wells 4a, 4b, respectively, extend more deeply into n-type substrate 2 than p+ regions 8a, 8b. For example, where the junction depth of p+ regions 8a, 8b is on the order of 0.3 μm, the depth of wells 4a, 4b is on the order of 3.0 μm. Similar p-wells as p-wells 4a, 4b are located elsewhere on the same integrated circuit, into which n-channel transistors are formed according to well known complementary MOS (CMOS) process techniques. The impurity concentration of p-wells 4a, 4b is preferably selected according to that desired for the n-channel active transistors, for example ranging from on the order of $5E15 cm^{-3}$ to $5E16 cm^{-3}$.

Heavily doped n+ region 10 is formed on the opposite side of field oxide structure 6b from p+ region 8b, serving as a so-called "strap" contact to n-well 3b. As is well known in the art, normal operation of the integrated circuit requires that all metallurgical junctions to n-wells 3a, 3b be reverse-biased to prevent substrate leakage. Accordingly, in normal operation, n-well 3b (and n-well 3a via n-well 3b and n-type substrate 2) will be biased to the highest available normal operating voltage, which in this case is the $V_{cc}$ power supply. N+ region 10 is preferably formed with the same steps as n+ source/drain regions in n-channel transistors elsewhere in the integrated circuit, and as such preferably has an impurity concentration of on the order of $2E20 cm^{-3}$ and is on the order of 0.15 μm deep.

Conventional interlevel dielectric layer 12 overlies the components in this protection circuit, in the same manner as provided elsewhere in the integrated circuit. An example of interlevel dielectric layer 12 is an 800 nm thick film of silicon dioxide, deposited by way of chemical vapor deposition. Contact openings 18a, 18b, 18c are etched through interlevel dielectric layer 12, for contacting p+ regions 8a, 8b, and n+ region 10, respectively. Metallization layer 14, for example consisting of a layer of barrier metal underlying a layer of aluminum doped with silicon, copper, or both, is then formed over interlevel dielectric layer 12, to contact p+ regions 8a, 8b and n+ region 10 in the conventional manner. Conventional patterning and etching are then performed to define isolated ones of metal conductors 14a, 14b; in this example, conductor 14a serves as the bond pad to which external signals may be applied, and conductor 14b is connected to the $V_{cc}$ power supply voltage.

According to this embodiment of the invention, p-wells 4a, 4b underlie each location at which metallization layer 14 makes contact to p+ regions 8a, 8b, respectively. P-wells 4a, 4b thus ensure that, even if aluminum atoms in metallization film 14 spike through p+ regions 8a, 8b, the spiked metal will not short out the p-n junction between p-wells 4a, 4b and n-type substrate 2. As is well known, such spiking is accelerated by local heating of the integrated circuit; since the current density can be quite high during an ESD event (although for a short time), the exposure of p+ regions 8a, 8b to ESD events increase the likelihood of junction spiking from metallization 14a, 14b, respectively, in the structure of FIG. 2. Tolerance for the diffusion of aluminum atoms from metallization layer 14 into and through p+ regions 8a, 8b is provided by p-wells 4a, 4b in this embodiment of the invention, as p-wells 4a, 4b move the metallurgical p-n junction to substrate 2 further away from metallization 14a, 14b at locations directly under contacts 18a, 18b.

In addition, as is also well known, junction capacitance is dependent upon the impurity concentration on either side of the metallurgical junction, particularly the higher concentration side. As a result, p-wells 4a, 4b reduce the area over which p+ regions 8a, 8b are in contact with n-type substrate 2, and provide a more lightly-doped interface with substrate 2. Accordingly, the parasitic junction capacitance presented by p+ regions 8a, 8b in this embodiment of the invention is much reduced from what it would be in the absence of wells 8a, 8b. Undesired parasitic effects of the protection device on the normal operating performance of the integrated circuit are thus much reduced in this embodiment of the invention.

A parasitic p-channel MOS transistor is present in the structure of FIG. 2, considering field oxide structure 6a and overlying interlevel dielectric 12 as the gate dielectric, p+ regions 8a, 8b as the drain and source, respectively, and pad 14a as the gate electrode. As noted hereinabove, pad 14a is also in contact with p+ region 8a, and thus the gate of this parasitic transistor is connected to its drain. Metallization 14b is in contact with p+ region 8b, and is connected to $V_{cc}$. The back bias node of this parasitic transistor is biased to $V_{cc}$ via n+ region 10 and substrate 2. Due to this construction, the parasitic transistor will conduct between p+ regions 8a and 8b (i.e., from $V_{cc}$ to pad 14a) when the gate-to-source voltage (and drain-to-source voltage) exceeds the threshold voltage of the parasitic transistor. Due to the thickness of field oxide 6a and interlevel dielectric 12, as well as to the impurity concentration of substrate 2 thereunder augmented by any channel-stop implant, it is contemplated that the threshold voltage of this transistor will be quite high, for example on the order of 30 volts. The punch-through voltage is also expected to be quite high, for example on the order of 20 volts.

For purposes of the present invention, as will be described hereinbelow, junction breakdown is the preferred mechanism by which p-n-p bipolar transistor 13 is triggered in this embodiment of the invention. Accordingly, it is preferred that the boundary of p+ region 8a adjacent to field oxide structure 6a define the junction at which breakdown is to occur in an ESD event, rather than the much more lightly doped p-well 4a (as the breakdown voltage is significantly higher for more lightly-doped junctions). This is accomplished, in this embodiment of the invention, by placing the edges of p-wells 4a, 4b well back from the edges of field oxide 6a, for example by at least 1.0 μm. Such placement may of course be effected by way of masked well implants, or by any one of a number of other well-known techniques in the formation of such wells. P-wells 4a, 4b thus provide sufficient protection against junction spiking, but do not adversely increase the junction breakdown voltage at p+ region 8a.

For the example of the construction given hereinabove, the junction breakdown voltage at the junction between p+ region 8a and n-well 3a, in particular at location 25 of FIG. 2 which is the junction between p+ region 8a and implanted region 7, is on the order of 16 volts. Accordingly, a negative voltage on pad 14a relative to $V_{cc}$ exceeding this threshold voltage will initiate conduction between p+ region 8a and substrate. Diode 11 at the junction of p+ region 8a and n-well 3a (at implanted region 7) thus serves as a triggering device for high capacity discharge conduction via bipolar transistor 13 in this embodiment of the invention. The triggering voltage, namely the junction breakdown voltage, can be selected by the n-type channel stop implant dose used in forming region 7.

As noted hereinabove, the threshold voltage of the parasitic p-channel field oxide transistor is, in contrast, on the order of 30 volts, and the punch-through voltage is on the order of 20 volts. As such, junction breakdown will occur at a voltage lower than that necessary to turn on the parasitic transistor by either MOS conduction or by punch-through. It is contemplated, however, that the structure according to this embodiment of the invention will adequately discharge a negative polarity ESD event at pad 14a even if the MOS threshold voltage or the punch-through voltage is lower than the junction breakdown (e.g., if no n-type channel stop implant is performed). This is because the lateral conduction between p+ regions 8a, 8b, either by punch-through or via an inverted channel, will generally not be sufficient to maintain the voltage at p+ region 8a below the junction breakdown voltage; accordingly, even where source-drain conduction is present, the junction will still eventually break down at location 25. While the setting of the junction breakdown voltage below the field oxide transistor threshold voltage and punch-through voltage is preferred in order to control the firing voltage of the protection circuit, source-drain conduction between p+ regions 8a, 8b may also serve to safely discharge some amount of energy during an ESD event, and therefore may be preferable in some situations.

Bipolar transistor 13 is implemented in this structure, having p-well 4a as the collector, p+ region 8b (and p-well 4b) as the emitter, and n-well 3a as the base; p+ region 8a serves as the collector contact and n+ region 10 serves as the base contact. Resistor 9 is also implemented in this structure as connected in series between emitter 8b and base contact 10. According to the present invention, resistor 9 provides a voltage drop between the base and emitter of bipolar transistor 13, during breakdown of the junction between p+ region 8a and n-well 3a at location 25. This voltage drop is intended to be sufficient to forward-bias the junction between substrate 102 and p+ region 8b, initiating bipolar conduction of bipolar transistor 13. As is well known, bipolar conduction provides high capacity conduction with fast response, and as such is an attractive mechanism in ESD protection circuits.

According to the present invention, bipolar conduction is facilitated and controlled by defining the value of resistor 9 so that it has a sufficiently high value that the conduction from junction breakdown will initiate bipolar conduction. The resistance value of resistor 9 depends primarily upon the impurity concentration of n-well 3b, as most of its length is determined by the distance d across field oxide structure 6b, between p+ region 8b and n+ region 10 under field oxide structure 6b; the distance across p-well 4b between n-wells 3a, 3b is relatively short, and accordingly does not greatly affect the resistance value of resistor 9, even though substrate 2 is more lightly doped than n-well 3b. For n-well 3b having an impurity concentration of on the order of 1E16cm$^{-3}$, a distance d of approximately 6.0$\mu$ will result in a resistance value of on the order of 500 $\Omega$.

As a result, the structure according to the preferred embodiment of the invention allows for selection of both the firing voltage and the triggering current for the ESD protection circuit. The firing voltage is selected by way of the n-type implant under field oxide 6, creating doped region 7 thereunder and determining the junction breakdown voltage. In addition, the current required for triggering bipolar conduction can be selected by way of the value of resistor 9, and is determined by distance d across field oxide structure 6b.

Figure 3:
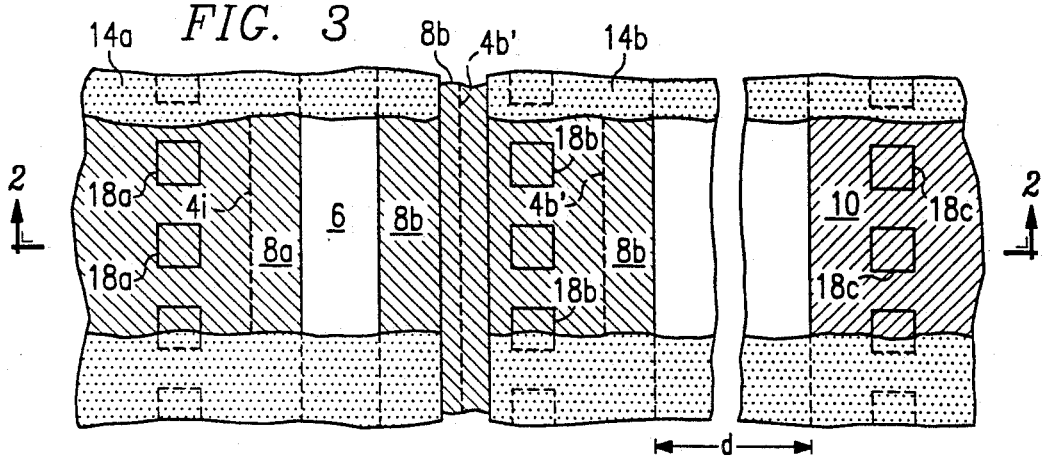
FIG. 3 is a plan view of a portion of the devices of FIG. 2, shown in partial cutaway through the overlying metallization.
Figure 4A:
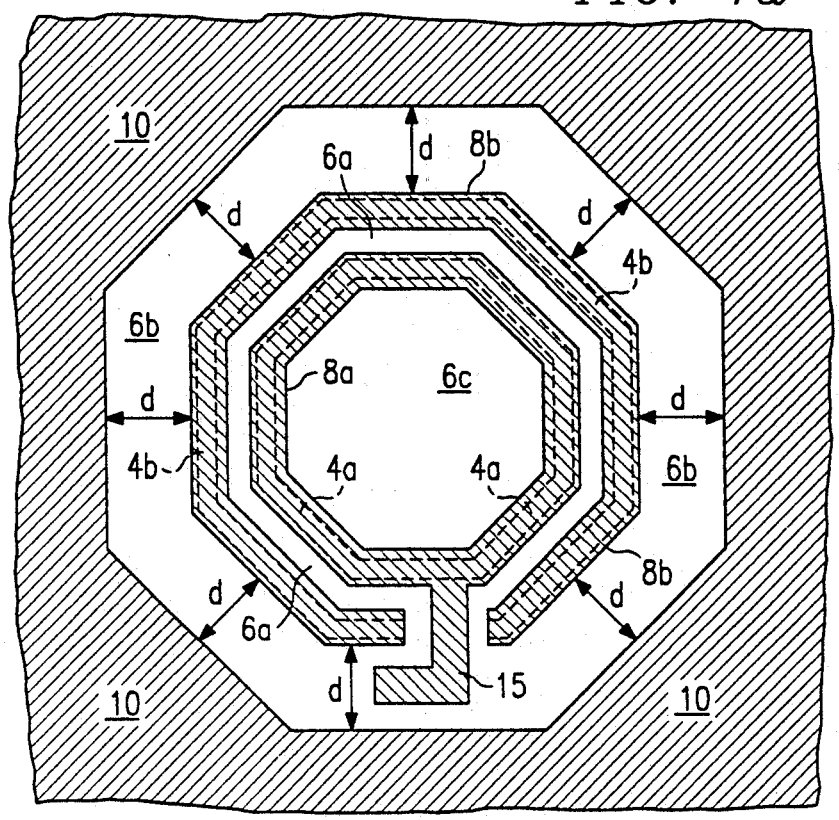
FIGS. 4a and 4b are plan views of a bond pad incorporating the devices constructed according to the preferred embodiment of the invention, in different stages of manufacture.
Figure 4B:
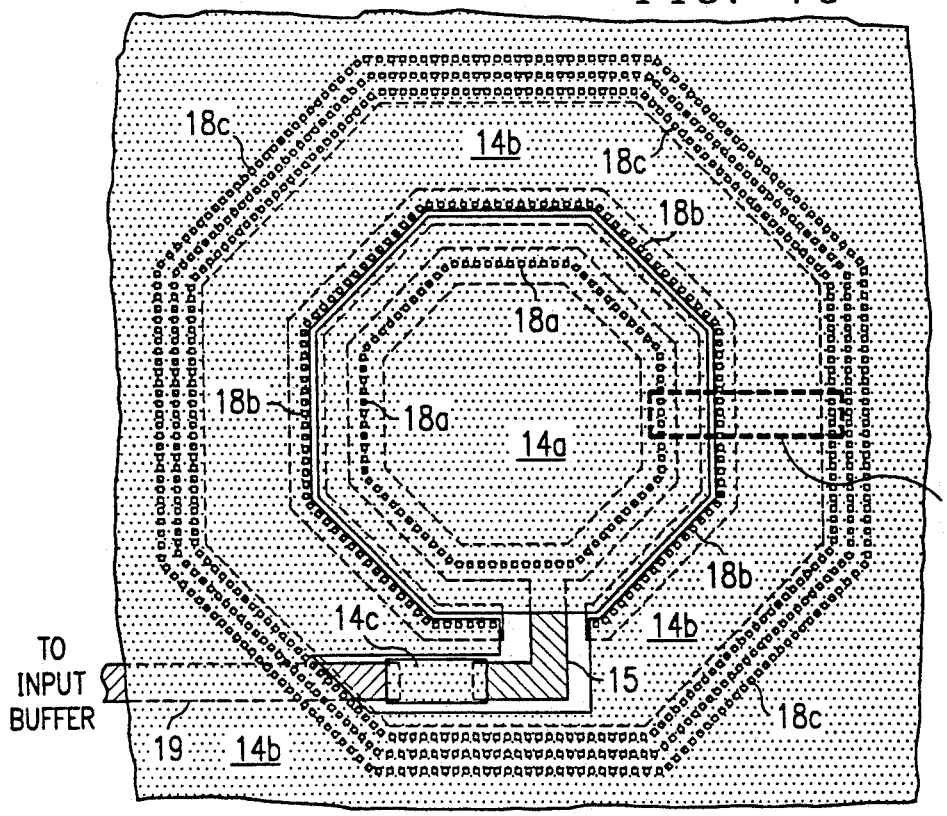
Figure 5A:
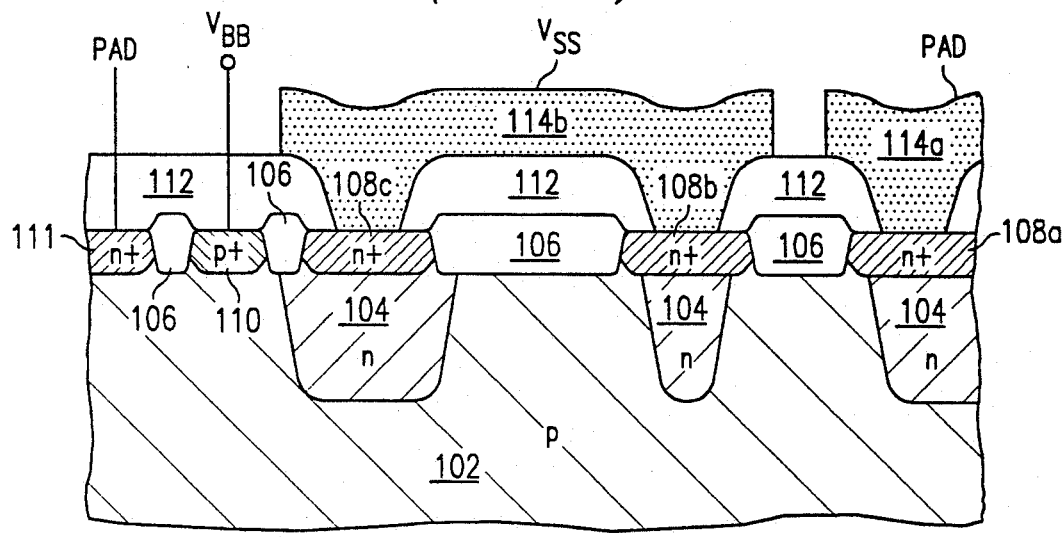
FIG. 5a is a cross-sectional elevation of a prior art ESD protection scheme.
Figure 5B:
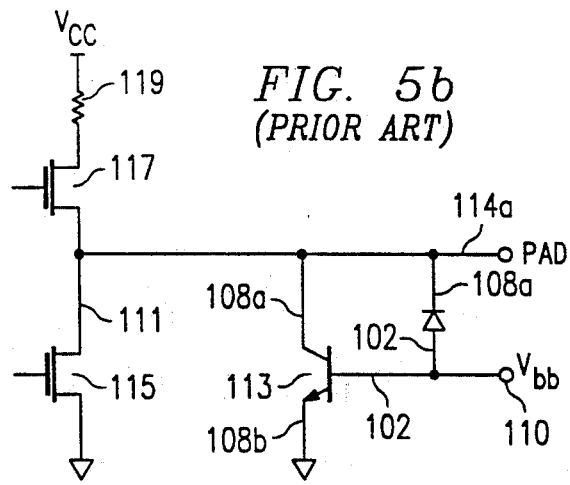

Referring now to FIGS. 3, 4a and 4b, an example of the layout of the ESD protection circuit discussed hereinabove will now be described. FIG. 4a illustrates the location of an entire bond pad prior to formation of metallization 14a, 14b. As is well known, metal bond pads are preferably formed over field oxide 6 to provide mechanical strength. In this embodiment of the invention, field oxide structure 6c is present in the center of the bond pad area, with p+ region 8a encircling the same. As described hereinabove relative to FIG. 2, p-well 4a is provided within p+ region 8a around the entire periphery of field oxide 6c. Diffusion region 15 extends from p+ region 8a, for forming a series resistor thereat. Field oxide structure 6a surrounds p+ region 8a, except for the side from which resistor 15 extends; for purposes of chip area efficiency, the distance across field oxide structure 6a is preferably minimized to that set by the design rules for leakage. P+ region 8b surrounds field oxide structure 6a (on all sides except for the location of resistor 15), with p-well 4b formed therewithin as illustrated in FIG. 2. Field oxide structure 6b surrounds p+ region 8b, and n+ region 10 surrounds field oxide structure 6b.

As discussed hereinabove, the value of resistor 9 in bipolar transistor 13 is set by the distance d across field oxide structure 6b surrounding p+ region 8b (i.e., the distance between the base contact of n+ region 10 and the emitter contact of p+ region 8b, on the side nearest n+ region 8a). For purposes of high conductivity, it is also preferred that the width of the base region of bipolar transistor 13 be maximized. It is also quite important that the distance d be relatively uniform, so that no localized narrow paths exist at which current crowding may occur. As illustrated in FIG. 4a, uniformity of the length d is obtained by reducing the angles at the corners of the bond pad from 90° to approximately 45°. As such, the distance across field oxide structure 6b is maintained at substantially distance d around the entirety of the bond pad; the distance may be greater than d at the 45° corners. In addition, this construction in which the angles of the corners are 45° or less offers more uniform junction breakdown over the entire width of the structure, as the electric field concentration is reduced from that which would occur at 90° corners. In addition, the base width of bipolar transistor 13 is maximized, and thus the conduction capacity of transistor 13, by using as much of the perimeter around p+ region 8b as possible.

Referring now to FIG. 4b, the structure of FIG. 4a is illustrated after formation of metal bond pad 14a and metal electrode 14b. Contact is made between metal bond pad 14a and p+ region 8a via multiple contacts 18a thereunder. Region 3 of FIG. 4 corresponds to the expanded view illustrated, in cutaway, in FIG. 3. Contacts 18a, are distributed around the perimeter of pad 14a, and are preferably formed as multiple square or round contacts rather than as a long rectangular contacts, to minimize current crowding effects thereat.

Metallization 14b, connected to V$_{cc}$, encircles pad 14a, and includes multiple contacts 18b to p+ region 8b (not shown) thereunder, and multiple contacts 18c to n+ region 10 (also not shown) thereunder. In this example of an input pad in a MOS integrated circuit, contact is made by metallization 14c to p-type diffused resistor 15 on one side of pad 14a. Polysilicon jumper 19 is connected to metallization 14c, and allows n+ region 10 to extend thereunder. As noted hereinabove, p-type diffused resistor 15 presents series resistance, of on the order of 1 k$\Omega$, between pad 14a and the gates of MOS transistors controlled thereby, adding protection to the gate dielectric of the internal transistors from ESD events.

It is well known that output buffers for MOS transistors generally do not require series resistors for ESD protection; this is believed to be due to the large area provided by the driver transistors and thus the large capacity for discharge therethrough. Since inputs of MOS integrated circuits are generally connected to relatively small structures, for purposes of speed, series resistors have generally been required in order to protect the circuit from an ESD event. Such resistors, on the order of 1 k$\Omega$, insert RC delay into the response of the circuit to a switching input; for modern circuits, such delay may be on the order of 0.25 nsec. Particularly for high performance devices such as high speed static RAMs, such a penalty is quite significant. It is contemplated that the size and capacity of bipolar transistor 13 according to this embodiment of the invention, maximized by deploying its base fully around the bond pad, may provide sufficient ESD capacity to allow deletion of the series resistor, thus further reducing the impact of ESD protection on device performance.

FIG. 3 particularly illustrates a portion of the layout of this embodiment of the ESD protection devices, with a portion of overlying metallization 14a, 14b cut away for purposes of clarity of description. As is evident from FIG. 4, the structure illustrated in detail in FIG. 3 is present on all four sides of pad 14a.

In operation, pad 14a may be exposed to ESD events of either polarity relative to V$_{cc}$. In the case of an ESD event of a positive polarity relative to V$_{cc}$, the p-n junction between p+ region 8a (and p-well 4a) and n-well 3a will be forward biased, and the current will safely be conducted to V$_{cc}$, assuming that proper layout considerations have been followed so that the current density is not excessive at any location of the integrated circuit.

A negative polarity voltage applied to pad 14a relative to power supply V$_{cc}$ will reverse bias the junction diode between p+ region 8a and p-well 4a, on the one hand, and n-type substrate 2 on the other hand. In the case of an ESD event of this polarity, the reverse-bias voltage at this junction will rapidly increase to a magnitude sufficient to cause junction breakdown at the junction between p+ region 8a and n-well 3a, particularly to implanted region 7 (if present). The proximity of p+ region 8b, biased to V$_{cc}$, to p+ region 8a, separated from one another by a distance of on the order of 1.2 $\mu$m (the width of field oxide structure 6a), causes junction breakdown to occur at the edge of p+ region 8a nearest field oxide structure 6a, at location 25 (in FIG. 2).

As is well known, p-n junction breakdown of the avalanche type generates a large number of electron-hole pairs in the space-charge region near the junction. These electron-hole pairs effect a net current, with the electrons traveling to the positively biased electrode (p+ region 8b and p-well 4b), and the holes traveling to the negatively biased electrode (p+ region 8a and p-well 4a). Due to the resistance of n-type substrate 2 over the distance between the junction at p+ region 8b on the one hand, and n+ contact region 10 on the other hand, a voltage drop occurs within n-type substrate 2. Proper selection of the distance d across field oxide structure 6b ensures that this voltage drop causes the junction between p+ region 8b and substrate 2 to become forward biased. As is well known, forward bias of the emitter-base junction in combination with reverse bias of the collector-base junction causes bipolar conduction between collector and emitter.

As noted above, p-n-p transistor 13 is present in this structure, considering n-type substrate 2 as the base (and n+ region 10 as the base contact), p+ region 8b and p-well 4b as the emitter, and p-well 4a as the collector. Accordingly, at such time as the base-emitter junction of this p-n-p transistor is forward biased, due to the conduction initiated by junction breakdown and the voltage drop across resistor 9 (primarily n-well 3b), bipolar conduction of this lateral p-n-p transistor 13 begins between collector (p-well 4a) and emitter (p+ region 8b). The bipolar conduction capacity of transistor 13 greatly exceeds that of the junction breakdown, and thus effects additional capacity for the safe discharge of the negative statically charged body in contact with pad 14a.

Even during bipolar conduction, thermal runaway can occur if proper layout considerations are not made. Referring back to FIG. 2, it should be noted that p+ region 8b, serving as the emitter of transistor 13, is set back from the edge of field oxide structure 6a. As such, emitter p+ region 8b includes some amount of series resistance, depending upon the conductivity of p+ region 8b and the distance EL. It is therefore preferred that the distance EL be somewhat larger than the minimum layout rule for the circuit. For example, where the design rules preclude such contact within 1.0μ of the edge of active region 8b, the distance EL may be on the order of 4.0μ. The series resistance provided by such construction, thus incorporating series resistance between collector and emitter, thus reduces the likelihood of "hot spots" occurring during bipolar conduction, providing protection against thermal runaway.

Therefore, the preferred embodiment of the invention described hereinabove provides safe conduction paths for ESD in integrated circuits, including those having small feature sizes and thus high sensitivity to ESD events. In particular, the present invention allows for selection of a series base resistor, thus allowing control of the level of triggering current from junction breakdown necessary to initiate bipolar conduction. According to the preferred embodiment of the invention, the base resistance can be made uniform over its width, eliminating current crowding which can preclude bipolar conduction. Furthermore, the width of the base region is maximized according to the present invention, by providing the bipolar transistor on multiple sides of the bond pad terminal.

Additional features of the preferred embodiment provide still further benefits. A channel-stop, or punch-through, implant under field oxide can be used to select the junction breakdown voltage of the triggering device, and thus the firing voltage of the bipolar transistor. Another benefit may be obtained by providing wells within heavily doped regions, protecting against junction leakage due to metal spiking and also reducing the parasitic junction capacitance of the protection devices. Series emitter resistance may also be incorporated into the bipolar transistor, reducing the possibility of localized hot spots, and thermal runaway, during bipolar conduction. Direct metal connection to collector, base and emitter regions also provides for low series resistance, and thus excellent conduction with minimal resistive heating.

While the invention has been described herein relative to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. An ESD protection circuit for an integrated circuit, comprising:
   first and second terminals, said first terminal for communicating signals externally from said integrated circuit;
   a first doped region at a semiconducting surface of a body, doped to a first conductivity type and connected to said fist terminal, said semiconducting surface being doped to a second conductivity type;
   a first insulating structure at said surface, said first insulating structure defining an outer edge of said first doped region, and overlying a portion of said semiconducting surface of said second conductivity type;
   a second doped region at said surface and substantially surrounding said first insulating structure, said second doped region doped to said first conductivity type and coupled to said second terminal;
   a second insulating structure at said surface and substantially surrounding said second doped region, a substantial portion of the length of said second insulating structure located around a perimeter of said second doped region; and
   a third doped region at said surface and substantially surrounding said second insulating structure, said third doped region doped to said second conductivity type and coupled to said second terminal;
   wherein the distance across said second insulating structure from said second doped region to said third doped region is substantially uniform around the perimeter of said second doped region.

2. The circuit of claim 1, wherein said first conductivity type is p-type and said second conductivity type is n-type;
   and further comprising:
   a fourth doped region, underlying said first insulating structure, said fourth doped region being n-type and more heavily doped than said semiconducting surface.

3. The circuit of claim 1, further comprising:

a first well region of said first conductivity type and underlying a portion of said first doped region.

4. The circuit of claim 3, wherein said first terminal is connected to said first doped region by way of a metal contact thereto;
and wherein said first well region underlies the location of said metal contact.

5. The circuit of claim 4, wherein said first well region does not underlie a portion of said first doped region adjacent said first insulating structure.

6. The circuit of claim 4, further comprising:
a second well region of said first conductivity type and underlying a portion of said second doped region;
wherein said second terminal is connected to said second doped region by way of a metal contact thereto;
and wherein said second well region underlies the location of said metal contact to said second doped region.

7. The circuit of claim 1, wherein said first terminal is an input terminal.

8. The circuit of claim 7, further comprising:
an input buffer circuit; and
a resistor connected between said first doped region and said input buffer circuit.

9. The circuit of claim 1, wherein said first terminal is an output terminal.

10. An ESD protection circuit for an integrated circuit, comprising:
first and second terminals, said first terminal for communicating signals externally from said integrated circuit;
a first doped region at a semiconducting surface of a body, doped to a first conductivity type and connected to said first terminal, said semiconducting surface being doped to a second conductivity type;
a first insulating structure at said surface, said first insulating structure defining an outer edge of said first doped region, and overlying a portion of said semiconducting surface of said second conductivity type;
a second doped region at said surface and substantially surrounding said first insulating structure, said second doped region doped to said first conductivity type and coupled to said second terminal;
a second insulating structure at said surface and substantially surrounding said second doped region, a substantial portion of the length of said second insulating structure located around a perimeter of said second doped region; and
a third doped region at said surface and substantially surrounding said second insulating structure, said third doped region doped said second conductivity type and coupled to said second terminal;
wherein the distance across said second insulating structure from said second doped region to said third doped region is substantially uniform around the perimeter of said second doped region;
and wherein the distance across said second insulating structure is greater than the distance across said first insulating structure from said first doped region to said second doped region.

11. In an integrated circuit having a first terminal and a power supply terminal, said integrated circuit formed at a semiconducting surface of a body, said surface having a first conductivity type, a protection circuit against electrostatic discharge comprising:

a diode, having a first side connected to said first terminal and a second side connected to said semiconducting surface;
a lateral bipolar transistor, comprising:
a collector region of a second conductivity type formed at said surface, and connected to said first side of said diode;
an emitter region of said second conductivity type formed at said surface, and coupled to said power supply terminal, and separated from said collector region by a first insulating structure at said surface therebetween, said emitter region and said first insulating structure substantially surrounding a perimeter of said collector region; and
a base contact region of said first conductivity type formed at said surface, and coupled to said power supply terminal, said base contact region separated from said emitter region by a second insulating structure at said surface therebetween, said base contact region and said second insulating structure substantially surrounding a perimeter of said emitter region; and
a resistor, defined by a portion of said semiconducting surface under said second insulating structure between said emitter region and said base contact region, the distance across said second insulating structure between said emitter region and said base contact region being substantially uniform over most of its length to define a resistance value sufficient to forward bias a junction between said surface and said emitter region responsive to said diode being in a junction breakdown condition.

12. The circuit of claim 11, wherein said first conductivity type is n-type and said second conductivity type is p-type.

13. The circuit of claim 12, further comprising:
an n-type doped region underlying said first insulating structure, said n-type doped region being more heavily doped than said semiconducting surface.

14. The circuit of claim 11, further comprising:
a doped region of said first conductivity type underlying said first insulating structure, said doped region being more heavily doped than said semiconducting surface.

15. The circuit of claim 11, further comprising:
functional circuitry coupled to said first terminal.

16. The circuit of claim 15, further comprising:
an input buffer coupled between said first terminal and said functional circuitry.

17. The circuit of claim 11, wherein said first terminal is coupled to said first side of said diode by a metal contact to said collector region;
and further comprising a well, of said second conductivity type, underlying the location at which said metal contact is made to said collector region.

18. The circuit of claim 11, wherein said first side of said diode consists of said collector region.

19. The circuit of claim 18, wherein a portion of said collector region located adjacent said first insulating structure directly forms thereat a metallurgical p-n junction with said semiconducting surface.

20. In an integrated circuit having a first terminal and a power supply terminal, said integrated circuit formed at a semiconducting surface of a body, said surface having a first conductivity type, a protection circuit against electrostatic discharge comprising:

a diode, having a first side connected to said first terminal and a second side connected to said semiconducting surface;

a lateral bipolar transistor, comprising:

a collector region of a second conductivity type formed at said surface, and connected to said first side of said diode;

an emitter region of said second conductivity type formed at said surface, and coupled to said power supply terminal, and separated from said collector region by a first insulating structure at said surface therebetween, said emitter region and said first insulating structure substantially surrounding a perimeter of said collector region; and a base contact region of said first conductivity type formed at said surface, and coupled to said power supply terminal, said base contact region separated from said emitter region by a second insulating structure at said surface therebetween, said base contact region and said second insulating structure substantially surrounding a perimeter of said emitter region; and a resistor, defined by a portion of said semiconducting surface under said second insulating structure between said emitter region and said base contact region, the distance across said second insulating structure between said emitter region and said base contact region being substantially uniform over most of its length to define a resistance value sufficient to forward bias a junction between said surface and said emitter region responsive to said diode being in a junction breakdown condition;

and wherein the distance across said second insulating structure is significantly greater than the distance across the first insulating structure.

* * * * *

UNITED STATES PATENT AND TRADEMARK OFFICE
CERTIFICATE OF CORRECTION

PATENT NO.   : 5,272,371
DATED        : December 21, 1993
INVENTOR(S)  : William A. Bishop, Mehdi Zamanian and Tsiu C. Chan It is certified that error appears in the above-identified patent and that said Letters Patent is hereby corrected as shown below:

<u>Column 12,</u>
Beginning at line 28, claim 1 should read as shown below:

1.   An ESD protection circuit for a integrated circuit, comprising:
first and second terminal, said first terminal for communicating signals externally from said integrated circuit;
a first doped region at a semiconducting surface of a body, doped to a first conductivity type and connected to said first terminal, said semiconducting surface being doped to a second conductivity type;
a first insulating structure at said surface, said first insulating structure defining an outer egde of said first doped region, and overlying a portion of said semiconducting surface of said second conductivity type;
a second doped region at said surface and substantially surrounding said first insulating structure, said second doped region doped to said first conductivity type and coupled to said second terminal;
a second insulating structure at said surface and substantially surrounding said second doped region, a substantial portion of the length of said second insulating structure located around a perimeter of said second doped region; and
a third doped region at said surface and substantially surrounding said second insulating structure, said third doped region doped to said second conductivity type and coupled to said second terminal;
wherein the distance across said second insulating structure from said second doped region to said third doped region is substantially uniform around the perimeter of said second doped region Signed and Sealed this Thirty-first Day of December, 2002

JAMES E. ROGAN
*Director of the United States Patent and Trademark Office*